(12) United States Patent
Parker et al.

(10) Patent No.: US 6,876,530 B2
(45) Date of Patent: *Apr. 5, 2005

(54) TEST PROBE AND CONNECTOR

(75) Inventors: Matthew R. Parker, Hampton, NH (US); Arra D. Yeghiayan, Windham, NH (US); Thomas D. Coe, Boxford, MA (US)

(73) Assignee: QA Technology Company, Inc., Hampton, NH (US)

( * ) Notice: Subject to any disclaimer, the term of this patent is extended or adjusted under 35 U.S.C. 154(b) by 403 days.

This patent is subject to a terminal disclaimer.

(21) Appl. No.: 10/040,886

(22) Filed: Jan. 7, 2002

(65) Prior Publication Data

US 2002/0093355 A1 Jul. 18, 2002

Related U.S. Application Data

(63) Continuation-in-part of application No. 09/759,980, filed on Jan. 12, 2001.

(51) Int. Cl.$^7$ .................................................. H02H 1/00
(52) U.S. Cl. .......................... 361/58; 361/115; 361/234
(58) Field of Search ................................ 361/115, 118, 361/58, 234; 324/761, 754

(56) References Cited

U.S. PATENT DOCUMENTS

| | | | |
|---|---|---|---|
| 2,885,648 A | 5/1959 | King .............................. 339/36 |
| 4,164,704 A | 8/1979 | Kato et al. ............... 324/73 PC |
| 4,461,993 A | 7/1984 | Glau ....................... 324/158 P |
| 4,504,780 A | 3/1985 | Marsella ..................... 324/72.5 |
| 4,597,622 A | 7/1986 | Coe ........................... 339/95 R |
| 4,659,987 A | 4/1987 | Coe et al. ................. 324/158 P |
| 4,885,533 A | 12/1989 | Coe ......................... 324/158 P |
| 5,233,290 A | 8/1993 | Swart ........................ 324/72.5 |
| 5,485,096 A | 1/1996 | Aksu ........................... 324/761 |
| 5,499,933 A | 3/1996 | Sekine ........................ 439/482 |
| 5,576,631 A | 11/1996 | Stowers et al. ............. 324/761 |
| 5,633,597 A | 5/1997 | Stowers et al. ............. 324/761 |
| 5,801,544 A | 9/1998 | Swart et al. ................. 324/761 |
| 5,850,147 A | 12/1998 | Stowers et al. ............. 324/761 |
| 6,025,729 A | 2/2000 | Van Loan et al. ........... 324/755 |
| 6,034,532 A | 3/2000 | Tarzwell ..................... 324/761 |
| 6,066,957 A | 5/2000 | Van Loan et al. ........... 324/758 |
| 6,104,205 A | 8/2000 | Mawby ....................... 324/761 |
| 6,170,887 B1 | 1/2001 | Salomon-Bahls et al. ... 285/322 |
| 6,570,399 B2 * | 5/2003 | Yeghiayan et al. ......... 324/761 |

FOREIGN PATENT DOCUMENTS

| | | |
|---|---|---|
| CH | 622103 A5 | 3/1981 |
| DE | 4416.151 C1 | 7/1995 |
| EP | 0189179 B1 | 7/1986 |
| EP | 0237732 B1 | 9/1987 |
| GB | 2289380 A | 11/1995 |

OTHER PUBLICATIONS

Spring Probe Catalog, Everett/Charles, Inc., 1982, p. 8.
FEINMETALL Spring Contact Probes Catalog, 1998/99, pages on models F239, F207, F205.

* cited by examiner

Primary Examiner—Stephen W. Jackson
(74) Attorney, Agent, or Firm—Weingarten, Schurgin, Gagnebin & Lebovici LLP

(57) ABSTRACT

An improved probe includes a conductive tubular housing or body containing a coil spring and a conductive plunger movable in the housing and having a contact tip outwardly extending from one end of the housing. The plunger and tip are urged to a normally outward position by the bias force of the spring. The opposite end of the housing has an opening for mating with a conductive pin of a connector. The connector is retained in a mounting plate of an associated fixture and has terminal ends of desired configuration. The terminal end may include a wire-wrap pin, a crimp type terminal or wire jack for attachment to a wire, or the terminal may include a spring loaded pin for engagement with an associated electrical contact. An air tight seal may be provided between the probe and the connector and the connector may be mounted in a mounting such that when vacuum is applied to an associated test fixture, air cannot be drawn through the fixture or through the body of the probe.

15 Claims, 6 Drawing Sheets

TEST PROBE AND CONNECTOR

CROSS REFERENCE TO RELATED APPLICATIONS

This application is a continuation-in-part of U.S. application Ser. No. 09/759,980 entitled Test Probe and Connector, filed Jan. 12, 2001, the disclosure of which is incorporated by reference herein.

STATEMENT REGARDING FEDERALLY SPONSORED RESEARCH OR DEVELOPMENT

N/A

BACKGROUND OF THE INVENTION

The present invention relates to probes that are used in printed circuit board test fixtures and more particularly, to a socketless, leaktight replaceable probe for use in a test fixture.

It is known to provide testing fixtures for printed circuits boards (PCBs) and the like, for testing the integrity of the electrical connectivity of the circuit boards. A conventional embodiment of a testing apparatus is shown in FIG. 1, and includes a fixed, stationary substantially horizontal probe plate 10 and an overlying vertically spaced movable top plate 12. Top plate 12 is linked to probe plate 10 by means of a peripheral elastomeric spacer 14 which allows top plate 12 to vertically move towards probe plate 10 upon a vacuum being created inside the sealed enclosure formed by probe plate 10, spacer 14, top plate 12, and an overlying pressure plate (not shown) sealingly engaging the upper face of top plate 12. The downward movement of top plate 12 is accomplished by elastomeric spacer 14 partly collapsing under the movable top plate 12 being sucked downwards by the vacuum.

Top plate 12 holds on its upper surface a printed circuit board 18 which is securely anchored thereto by the above-mentioned pressure plate upon the vacuum being created. Circuit board 18 is spaced from top plate 12 by means of rigid spacers 20, 22 and is aligned, relative to probe plate 10, by means of a number of alignment rods 16 which are fixedly attached to probe plate 10 and which upwardly extend through and loosely engage respective vertically registering channels 23 provided in top plate 12 to engage alignment holes provided in circuit board 18.

A number of tapered channels 24 extend transversely through top plate 12, with a test probe 26 being located under and vertically registering with each channel 24. Each test probe 26 is fixedly attached to probe plate 10 in a manner described hereinafter, and vertically extends above and below probe plate 10. Top plate channels 24 further vertically register with electrical contact points 28 to be tested on printed circuit board 18 upon engagement with the probe tip of the test probe 26. Thus, upon top plate 12 moving downward, the probe tip of the test probe 26 abuts the selected contact point 28 to be tested on the printed circuit board 18. Through the instrumentality of known software, electric current is transmitted sequentially through selected probes to test the integrity of the electrical connectivity of the printed circuit board 18.

The probes 26 of known construction are removably inserted in a sleeve (socket) 30 fixedly anchored to the probe plate 10. Sleeve 30 in turn is connected to a computer-controlled circuit which allows electrical current to be selectively transmitted therethrough. Probe 26 includes a tube in which a plunger is vertically movable under the bias of a spring, between a lower and an upper limit position. The plunger, the tube and the sleeve are all electrically connected to each other, for allowing the electric current to be transmitted to the printed circuit board. The movable plunger is continuously biased upwardly, and is downwardly forced against the bias of the spring when the printed circuit board downwardly moves against the upper tips of the probes when the vacuum is created inside the sealed enclosure. The purpose of providing a probe which is distinct from its holding sleeve is that the probe has a limited life span, and will thus have to be changed after a certain number of uses because of wear.

Three important problems exist with the above-described conventional circuit board testing apparatus:

a) The first problem is that the stationary sleeves holding the probes prevent the use of more sturdy probes for any given probe spacing. In fact, the contact points of the probes on the printed circuit boards are closely adjacent to one another, and thus the probes need to be positioned in a closely adjacent fashion. This is becoming more and more important as the miniaturization of the printed circuit boards evolves. Thus, if the contact points of the probes on a printed circuit board are very close to one another, probes of a smaller diameter need to be used to allow the probes to be positioned closer to each other. Since the sleeves carrying the probes have a larger diameter than the probes themselves, circuit board contact points which are closer to one another require sleeves of smaller diameter, and consequently probes of even smaller diameter. Probes having a very small diameter are less sturdy and more prone to accidental breakage.

b) The second problem is that the vertical alignment of the probe tips with their respective registering circuit board contact points is in practice not always achieved. Indeed, when inserting the probes inside their respective sleeves, a certain vertical angular offset may occur. The top plate channels are tapered to promote self-alignment of the probes therein; however, the probe tips may still be slightly misaligned when they protrude beyond their respective channels in the space between the top plate and the printed circuit board. The consequence of this misalignment is that the probe tips may be allowed to contact the printed circuit board in a slightly offset fashion relative to their intended respective contact points, which may result in electric current not being transmitted to the circuit board. Thus, the testing software could falsely indicate a connection error.

c) The third problem also relates to a possible misalignment between the probe tips and their corresponding intended circuit board contact points, due to the fact that the alignment rods, which are used to position the circuit board, are fixed to the probe plate. Indeed, it is possible that a misalignment of the top plate relative to the probe plate may result in the top plate through-channels being laterally offset relative to their corresponding underlying probes, since the circuit board position is determined by the alignment rods which are integrally attached to the probe plate, while the position of the through-channels depends on the position of the top plate. If the through-channels are laterally offset relative to their corresponding probes, then certain probes may be laterally deflected by the edges of their corresponding through-channels when the top plate is lowered, which may result in the tips of these deflected probes abutting against the circuit board aside from their intended position. Again, the testing software would then detect a connection error on the printed circuit board where there is none.

Reference is here also made to U.S. Pat. No. 4,885,533 assigned to the assignee of the present application which discloses a probe which, in use, is firmly engaged in an electrically conductive socket mounted tightly in a dielectric plate of a PCB testing fixture.

BRIEF SUMMARY OF THE INVENTION

In accordance with the present invention an improved probe and connector are disclosed that are adapted for use in a printed circuit board test fixture. The probe includes a conductive tubular housing or body and a conductive plunger that is contained and movable within the housing. The plunger includes a contact tip that extends out one end of the housing. The plunger and tip are urged to a normally outward position by a bias force created by a coil spring disposed within the housing. At the opposing end of the probe from the contact tip, the probe end defines a bore that is suitable sized to receive a cooperative pin located at one end of a connector.

The connector includes a tubular body that may be mounted in a through-hole within a fixture plate. The connector may be fixedly retained within the fixture plate via an annular barb or a plurality of annular beads located on the tubular body. In a preferred embodiment, the connector includes the connector pin at one end and a terminal of a desired configuration at the opposing end. The terminal may include a wire-wrap pin, a crimp type terminal or wire jack for attachment to a wire, or a spring loaded plunger for wireless conductive engagement with an electrical contact such as is located on a printed circuit board. The connector pin receiving end of the probe may contain one or more detents for retaining in the end to retain the probe on the connector once the connector pin is disposed in assembled relation with the probe bore.

Additionally, the connector includes a tapered portion between the connector pin and the connector body. The tapered portion increases in diameter from the connector pin to the connector body so that an air tight seal is created between the probe and the connector upon seating of the pin receiving end of the probe over the connector pin.

Other features, aspects and advantages of the presently disclosed probe and connector will be apparent from the Detailed Description of the Invention that follows.

BRIEF DESCRIPTION OF THE SEVERAL VIEWS OF THE DRAWING

The invention will be more fully understood by reference to the following Detailed Description of the Invention in conjunction with the drawings, of which.

DETAILED DESCRIPTION OF THE INVENTION

Figure 1:
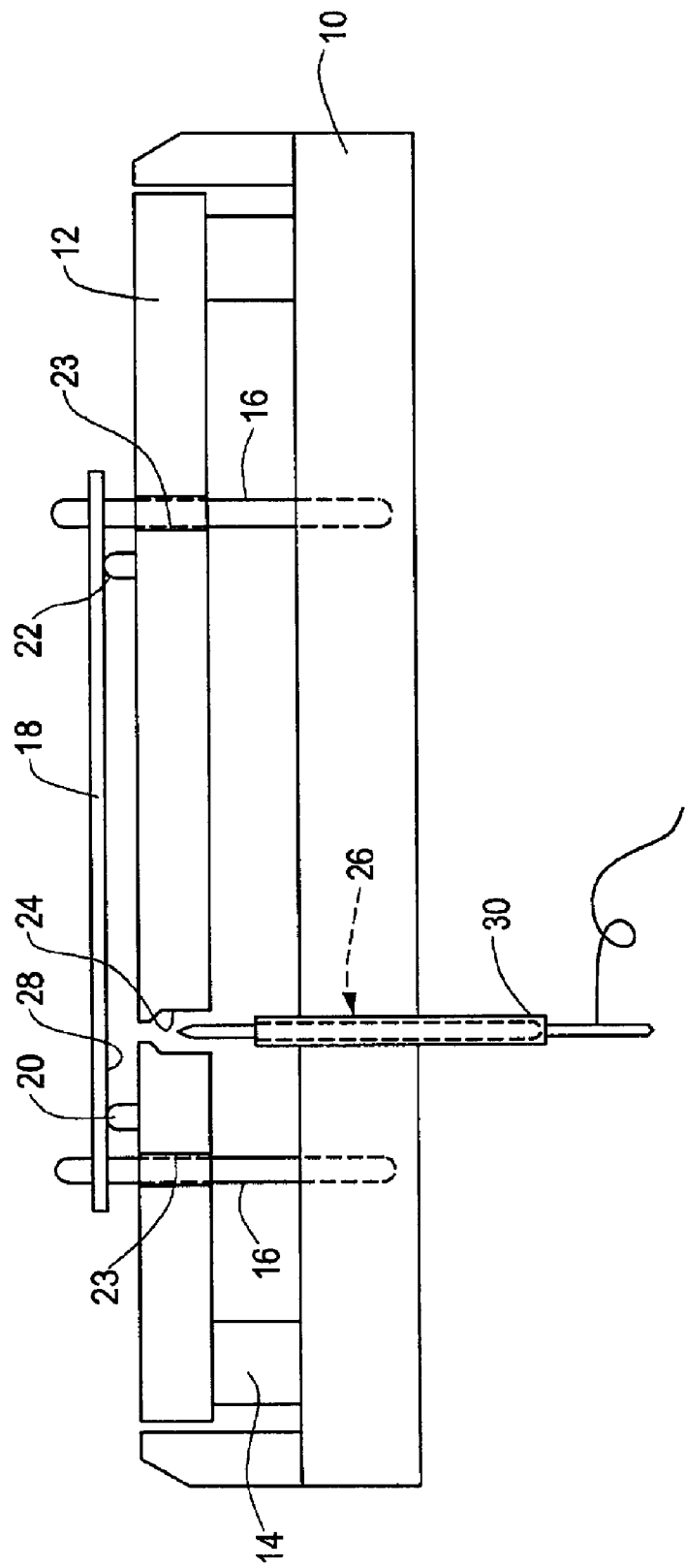
FIG. 1 is a schematic side elevation showing a prior art circuit board testing fixture.
Figure 2:
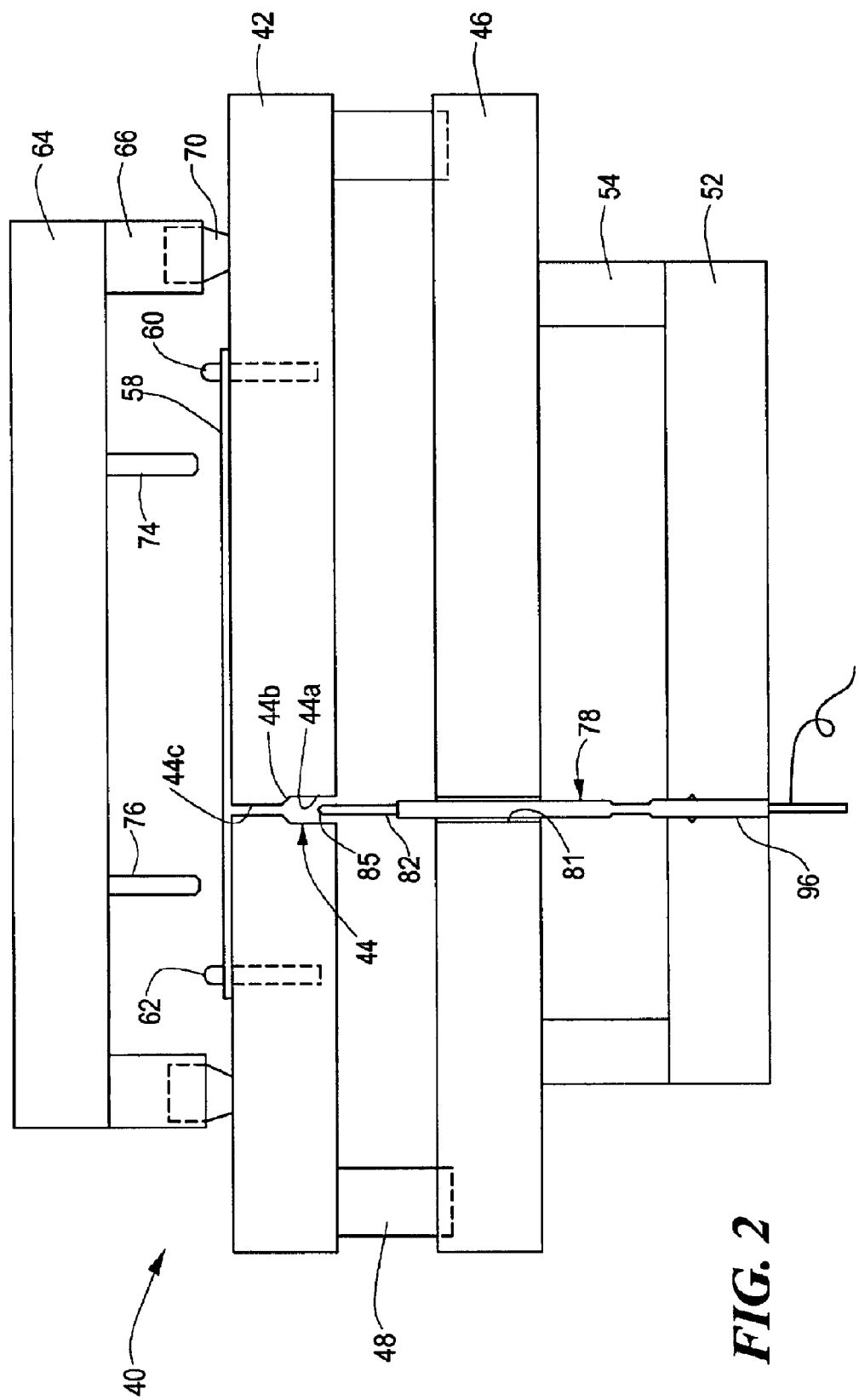
FIG. 2 is a schematic elevation showing a circuit board testing fixture according to the present invention.

FIG. 2 depicts a circuit board testing fixture 40 with a probe and one embodiment of probe connector in accordance with the present invention. A testing fixture 40 includes a movable dielectric top plate 42 provided with a number of bores 44 which transversely extend through the top plate 42. These will be detailed hereinafter. Testing fixture 40 further comprises a dielectric intermediate alignment plate 46 which is spaced from top plate 42 by a peripheral elastomeric spacer 48 of known construction. A dielectric lower probe plate 52 is located spaced under intermediate plate 46 by a rigid peripheral wall 54. A printed circuit board 58 to be tested is installed so as to rest on the top surface of top plate 42 and is properly positioned relative to top plate 42 by means of alignment rods 60, 62 which protrude from and are fixed to top plate 42 and which engage holes (not shown) in printed circuit board 58. As known in the art, a pressure plate 64 is positioned spacedly over printed circuit board 58, plate 64 being supported by a rigid peripheral wall 66 provided with an underlying peripheral elastomeric pad 70. Downwardly projecting fingers 74, 76 are integrally carried by an intermediate portion of pressure plate 64.

Figure 3:
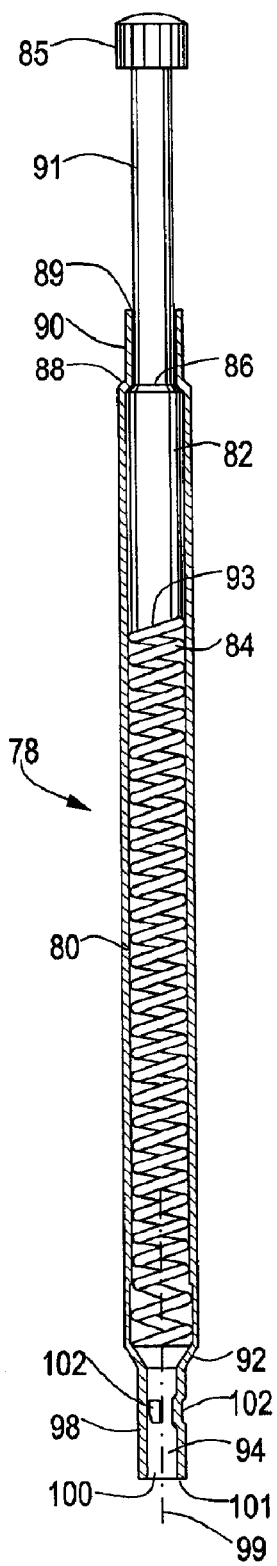
FIG. 3 is a cross-sectional side elevation of a sleeveless testing probe according to the present invention.
Figure 4:
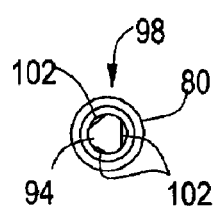
FIG. 4 is an under view of the probe of FIG. 3.

A number of testing probes 78 (only one testing probe being shown in FIG. 2) are provided on testing fixture 40. Referring to FIGS. 3 and 4, each testing probe 78 comprises a gold clad electrically conductive hollow tube 80 which is engaged by a vertically slidable gold-plated electrically conductive plunger 82 continuously upwardly biased by a coil spring 84. Plunger 82 has a gold-plated probe tip 85 and is provided at its intermediate portion with an annular shoulder 86 which abuts a complementary upper annular seat 88, adjacent the upper end of tube 80, to prevent plunger 82 from moving beyond an upper limit position under the bias of spring 84. Between the seat 88 and the open end 89 of the tube 80, through which the plunger 82 extends to the tip 85, is a reduced diameter elongate retaining and sliding bearing region 90 produced by swaging or rolling the tube 80 radially inwardly against a reduced diameter outer portion 91 of the plunger 82 connecting the annular shoulder 86 with the tip 85. This bearing region 90 has a close clearance with the outer portion 91 to provide excellent tolerance to side loading forces and smooth long life reciprocal axial movement of the plunger 82 against the bias of the spring 84 with no edges or corners to contact, scrape and wear the plunger 82. Additionally, the swaging or rolling of the tube 80 against the outer portion 91 of the plunger 82 produces the desired clearance between the bearing region 90 and the outer portion 91 as a result of material spring back (hysteresis) following the swaging or rolling operation.

Tube 80 also has a lower annular spring seat 92 against which rests the lower end of spring 84. Plunger 82 preferably has an inclined lower surface 93 which is engaged by the upper end of spring 84, to simultaneously bias plunger 82 upwardly and radially against tube 80 to ensure a reliable electrical connection between plunger 82 and tube 80. The lower end of tube 80 comprises an axial bore 94 for sealed resilient connection between tube 80 and a connector 96 (see FIG. 5) providing good electric transmissibility and probe support.

FIG. 2 show that probe 78 is carried by a connector 96 fixedly anchored in probe plate 52, and more particularly that connector 96 engages bore 94, as will be detailed hereinafter. Moreover, probe 78, and more particularly tube 80, extends through intermediate plate 46 in a registering guiding channel 81 provided therein.

A sealed enclosure is formed between lower probe plate 52 and pressure plate 64, with channels 81 and 44 providing for fluid communication the areas between plates 52, 46, 42 and 64. A vacuum port (not shown) is provided in probe plate 52, to allow a vacuum to be created in the sealed enclosure.

In use, a vacuum is created in the sealed enclosure, wherein the elastomeric peripheral spacer 48 will gradually collapse to allow top plate 42 to downwardly move towards intermediate plate 46 for the probe tips 85 to come into contact with selected registering contact points on printed circuit board 58; and wherein the peripheral elastomeric pad 70 will also collapse to allow pressure plate 64 to move towards top plate 42 whereby the fingers 74, 76 of pressure plate 64 will abut against and firmly support printed circuit board 58 against the upward bias of the numerous probe plungers 82.

The guiding channels 81 provided in intermediate plate 46 will correctly vertically align probes 78 so that they register with the contact points on circuit board 58 which they are intended to contact. Moreover, the top plate throughbores 44 also promote proper self-alignment of probes 78 relative to the corresponding circuit board contact points. Indeed, the top plate bores 44 each have a lower portion 44a of increased diameter, which allows the corresponding probe tip 85 to engage the bore 44 even if the probe tip is slightly misaligned; a tapered intermediate neck portion 44b, which allows the probe tip orientation to be corrected if it is slightly misaligned; and an elongate upper portion 44c which extends up to the printed circuit board 58 and which has a diameter to guide the corresponding probe tip 85 to the circuit board contact point.

Additionally, the fact that circuit board 58 rests directly on top plate 42 and is positioned thereon by means of the alignment rods 60, 62 which are fixedly attached to the top plate 42, ensures that the contact points of circuit board 58 which are intended to come into contact with respective probe tips 85, will be properly aligned relative to the top plate bores 44. Thus, in view of these improvements over prior art devices, misalignment of the probe tips 85 relative to their corresponding intended circuit board contact points is very unlikely, if not almost completely obviated.

Also, according to the invention, the testing probe 78 is not installed in a socket or sleeve, as with prior art devices. Indeed, probe 78 engages a connector 96 directly, through the instrumentality of its axial bore 94. The intermediate plate guiding channel 81 allows vertical alignment of the probe to be achieved even though no elongate supporting socket or sleeve is present.

The axial bore 94 is an elongate cylindrical bore defined by a cylindrical tubular extension 98 of the tube 80 opposite the elongate bearing 90. The tubular extension 98 extends from an annular shoulder forming the spring seat 92 and is coaxial with the longitudinal axis 99 of the tube 80, spring 84 and plunger 82. The tubular extension 98 defines a circular connector pin receiving opening 100 which is itself defined by a smooth circular inner edge 101.

The tubular extension 98, as with the bearing region 90, is integral with the remainder of the tube 80 and may be formed by rolling or swaging.

At least one detent 102 is pressed or stamped inwardly into the wall of the extension 98 intermediate the length of the extension 98 between the shoulder for the spring seat 92 and the opening 100. Preferably there are three such detents 102 evenly spaced about the circumference of the extension and in a plane normal to the axis 99. The detents 102 do not perforate the tubular extension 98.

Alternatively, the one or more detents can be provided in a separate tube, rather than the extension of the main tube.

Figure 5:
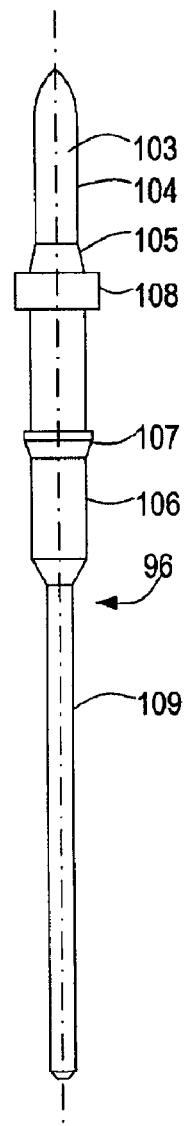
FIG. 5 is an elevation of one embodiment of connector for connecting and supporting the probe of FIG. 3.

Referring now to FIG. 5, a first embodiment of connector 96 is described. The connector 96 is gold plated, electrically conductive and includes a connector pin 103 terminating in an annular curved tip, to facilitate entry into probe bore 94 (FIG. 3) through opening 100 and a parallel portion 104 to closely fit within the probe bore 94 and to engage the detent(s) 102 to resiliently and firmly, but removably, support and retain the probe 78 on the connector 96 in good electrical contact therewith.

The inner end of pin 103 remote from the curved tip terminates with an annular taper 105 sized to sealingly engage the smooth circular edge 101 of the probe extension opening 100 when the connector pin 103 is fully engaged in the bore 94.

The connector pin 103 is connected to a wire-wrap pin 109 by way of a plate connector portion 106 sized to extend through plate 52 (FIG. 2) and to be fixedly mounted in a circular opening extending through the plate 52. The fixed mounting is, as shown, by an interference fit aided by an annular plate engaging ridge 107. Alternative fixed mountings could be provided by splines on the portion 106, the use of adhesives, molding-in, etc., as would be well known to those skilled in this technology.

A positive stop flange 108 is designed to control the degree of insertion of the connector 96 into the plate 52.

Typically, by way of example, for a probe having an O.D. of 0.054 inch, the bore 94 has an I.D. of 0.0265 inch and the pin 103 has a parallel portion 104 with an O.D. of 0.025±0.0003 inch, a taper 105 increasing from the parallel portion 104 to a maximum O.D. of 0.028±0.001 inch with an included angle of 15±2 degrees. Probes of these dimensions with sleeve mounting would require probe spacing in a fixture of 0.100 inch, whereas with the present invention a center spacing for the probes without sleeves may be reduced to 0.075 inch. Similarly, center to center reductions apply also to probes of other sizes.

Figure 6:
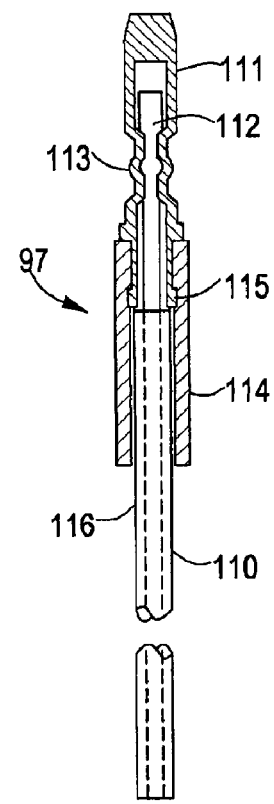
FIG. 6 is a sectional elevation of an alternative embodiment to the connector of FIG. 5.

FIG. 6 illustrates a second embodiment of connector 97. In this embodiment features common with those of the first embodiment of connector will not be described again. The connector 97 is a two-part assembly for connecting an insulated wire 110 to the probe 78 by way of a gold plated electrically conducting pin 111 externally similar to pin 103 but hollow to receive the electrical conductor 112 of the wire 110 which is crimped at 113 in the hollow interior of the pin 111 to provide good electrical interconnection. A polyester (nylon) sleeve 114 is attached to the pin 111 by an annular protrusion 115 on an extension of the pin 111. The sleeve 114 covers the junction of the pin 111 and the insulation 116 of the wire 110 and provides for the fixed engagement of the connector 97 in a circular opening in plate 52.

The connector(s) 96, 97 are sealingly engaged with the plate 52 to provide an air tight mounting such that air and any contaminants cannot be drawn through the fixture or the body of the probe when a vacuum is applied during a testing phase.

Figure 7:
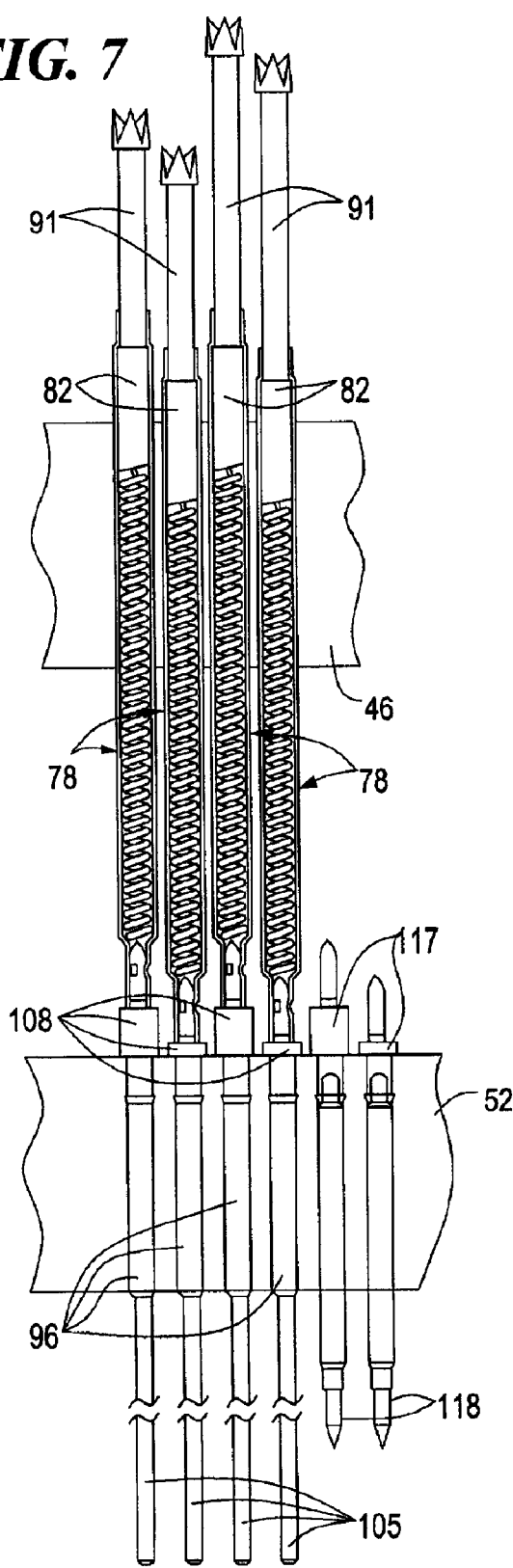
FIG. 7 is an illustrative arrangement showing various probe and connector implementations.

FIG. 7 illustrates a variety of probe arrangements providing differing probe heights achieved by varying the length of protruding outer portions 91 of the plungers 82 and/or the axial length of the stop flange 108 of the connectors 96 (or 97). Additionally, this figure shows two connectors 117, the ends 118 of which include wireless terminations for engaging a printed circuit test board. An exemplary connector that provides a wireless termination is illustrated in greater detail in FIG. 10 and is discussed below.

Figure 8:
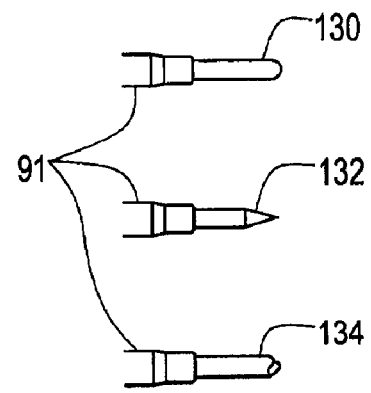
FIG. 8 is a partial side view of the probe plunger of FIG. 3 illustrating alternative embodiments of probe tips that may be employed.

The probe 78 may be provided with a probe tip of configurations that differ from the probe tip 85 depicted in FIG. 3. Referring to FIG. 8, exemplary alternative probe tips are shown. For example, a spherical probe tip 130, a spear probe tip 132 or a chisel probe tip 134 may be provided on the end of the plunger 91 intended to contact the printed circuit board 58. Probe tips of other configurations may also be used.

Figure 9:
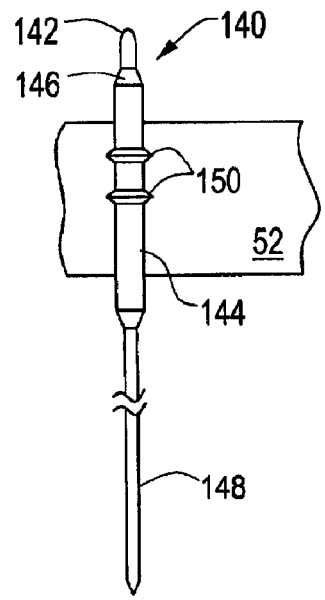
FIG. 9 is a schematic side elevation illustrating one embodiment of a connector for use with the test probe depicted in FIG. 3.

Referring to FIG. 9 an alternative embodiment of a connector 140 having a wirewrap pin termination is depicted installed in the lower probe plate 52. The connector 140 includes a connector pin 142, a plate connector portion 144 and an annular tapered portion 146 between the connector pin 142 and the plate connector portion 144. Additionally, the connector 140 includes a wire wrap pin 148 at the opposite end of the plate connector portion 144 from the connector pin 142. Two annular beads 150 are provided on the plate connector portion 144. The diameter of the annular beads 150 is specified to provide an interference fit with the respective hole in the lower probe plate 52. Upon insertion of the connector 140 within the respective hole in the probe plate 52, the annular beads 150 secure the connector within the probe plate 52 and maintain vertical alignment of the connector 140 within the probe plate 52.

Figure 10:
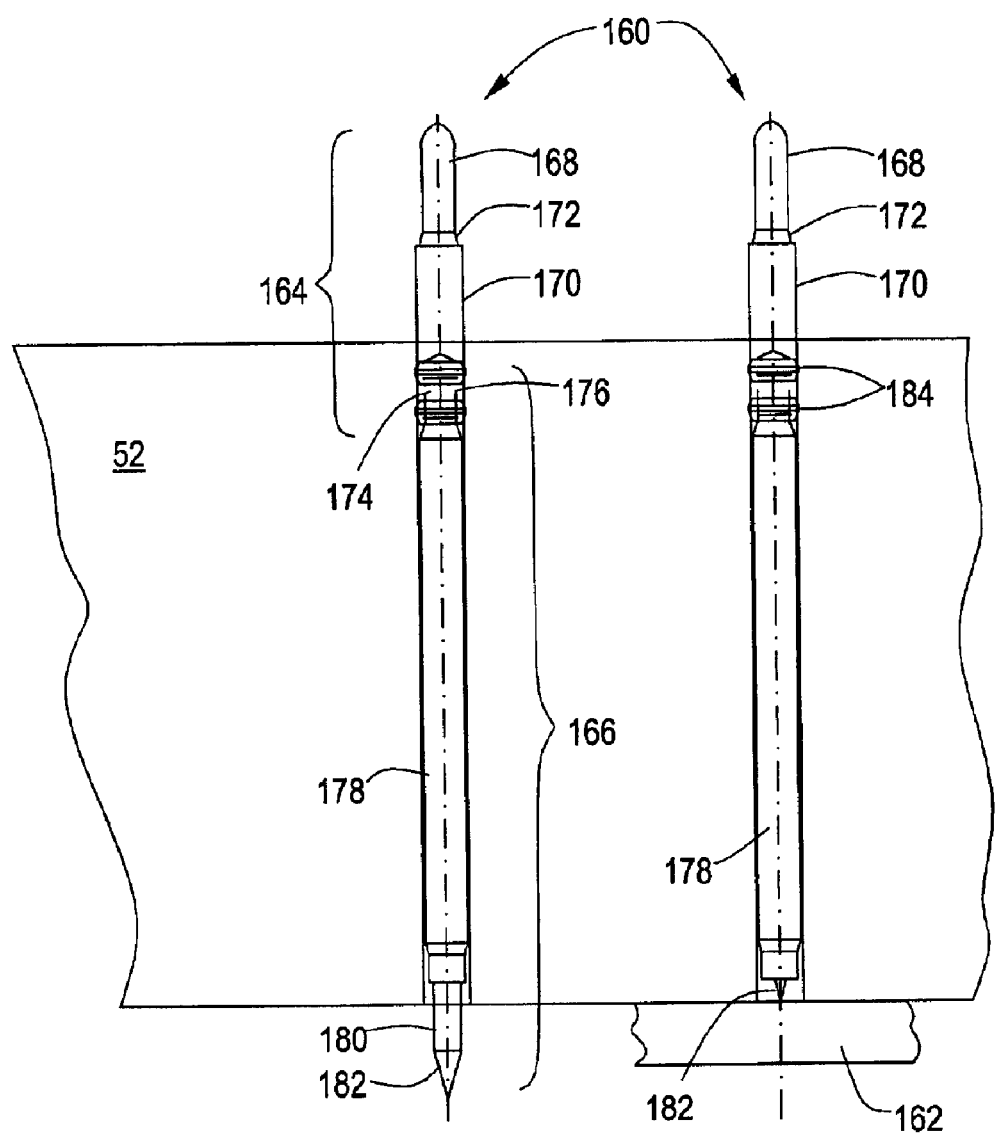
FIG. 10 is a schematic side elevation illustrating another embodiment of a connector for use with the test probe depicted in FIG. 3.

Referring to FIG. 10 a further embodiment of a connector 160 that provides a wireless termination is depicted both with a printed circuit board 162 present beneath the connector 160 and absent beneath the connector 160. The connector 160, in one embodiment, is fabricated in first and second connector portions 164 and 166 respectively. The first portion 164 includes a connector pin 168 for insertion within the axial bore 94 of the testing probe 78 (FIG. 3). Additionally, the first portion includes a body 170 and the connector pin 168 extends from one end of the body 170. A tapered annulus is provided between the connector pin 168 and the body 170 to provide a seal when the connector pin 168 is disposed within the axial bore 94 as discussed hereinabove. An axial bore 174 is provided in the end of the first portion 164 opposite the connector pin 168 to receive a cooperative mating pin 176 at one end of the second portion 166 of the connector 160. The mating pin 176 extends from one end of a tube 178. A probe 180 having a probe tip 182 is disposed within the tube 178 and is urged outward via a coiled bias spring (not shown). As shown in the connector 160 on the left in FIG. 10, the probe is disposed in an extended position the absence of the printed circuit board. As shown in the connector 160 on the right of FIG. 10, the probe tip 182 is urged into contact with the printed circuit board 162 so as to make an electrical connection with a contact point located on the printed circuit board 162. The first connector portion 164 includes two annular beads 184 for securing the first connector portion 164 within the lower probe plate 52 and maintaining vertical alignment of the connector 160 within the probe plate 52.

While the connector 160 is illustrated as being fabricated in first and second portions 164 and 166, in an alternative embodiment, a connector that permits wireless termination may be fabricated as a component that includes a tubular body portion having a connector pin at one end that is sized for insertion within the axial bore 94 of the testing probe 78. A probe is disposed within the tubular body and includes a probe tip that extends from the end of the body opposite the connector pin. A plurality of annular beads may be provided on the body to secure the connector within the lower probe plate 52. In this manner, the electrical connection between the mating pin 176 and the bore 174 of the first connector portion 164 depicted in FIG. 10 is eliminated.

Figure 11:
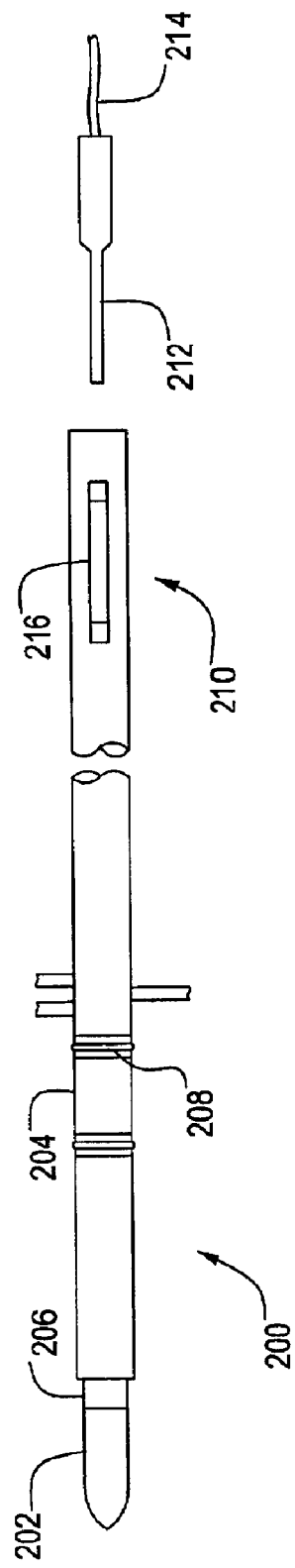
FIG. 11 is an elevation view of a further embodiment of the connector having a wire jack.
Figure 12:
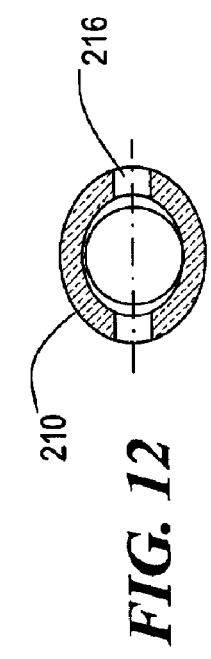
FIG. 12 is a cross-sectional view of the connector of FIG. 11 at the wire jack receptacle end.

Another embodiment of the connector is shown in FIG. 11 which provides a wire jack termination by which a wire can be pluggably mated to the connector. The connector 200 includes a connector pin 202, a plate connector portion 204 and an annular tapered portion 206 between the connector pin 202 and the plate connector portion 204. Two annular beads 208 are provided on the plate connector portion as in the above embodiment, the diameter of the annular beads being such to provide an interference fit with the respective hole in the probe plate 52. As in the connector embodiment described above, alternative fixed mountings can be provided by an annular plate engaging ridge, as in FIG. 5, or by splines, adhesives, molding-in, etc., as would be well known to those skilled in the technology. Upon insertion of the connector 200 within a respective hole in the probe plate, the annular beads secure the connector within the probe plate and maintain vertical alignment of the connector within the probe plate, in the same manner as described above. At the opposite end of the connector from the connector pin 202, there is provided a wire jack receptacle 210 which can pluggably receive a terminal pin 212 attached to a wire 214. The wire jack receptacle is formed by a blind hole drilled or otherwise provided in the end of the connector body and typically by a pair of diametrically opposite slots 216 through the wall of the wire jack end. The slots are typically formed by saw cuts. The slots provide crimpable walls of the receptacle end to provide a non-circular and typically slightly oval cross-section for interference fit of an inserted wire jack pin. The oval cross-section is illustrated in FIG. 12. It is seen that the receptacle end is crimped along an axis which is transverse to the slots. The slots also serve to allow flow of a plating solution during nickel or other plating of the receptacle end.

Figure 14:
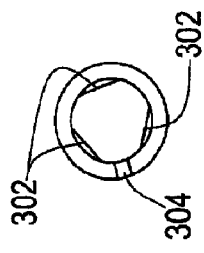
FIG. 14 is a cross sectional view of the embodiment of FIG. 13 at the wire jack receptacle end.
Figure 13:
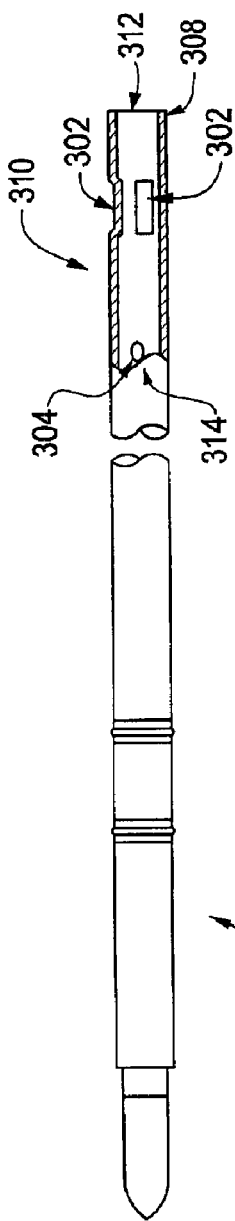
FIG. 13 is an elevation view of another embodiment of the connector having a wire jack.

FIG. 13 illustrates an alternative embodiment of the wire jack receptacle 310 of the connector 300. The wire jack receptacle is formed by a blind hole drilled or otherwise provided in the end of the connector body and by at least one detent 302 pressed or stamped inwardly into the wall of the connector 308 between the end 312 of the connector and the inner end of the blind hole 314. The detents 302 do not penetrate the wall of the connector 308. Preferably, there are three such detents 302 evenly spaced about the circumference of the connector between the end of the connector 312 and the end of the blind hole 314. At least one opening 304 is provided near the inner end of the blind hole 314 to facilitate the flow of a plating solution during nickel or other plating of the receptacle end. FIG. 14 illustrates an end view of this embodiment of the wire jack receptacle.

These embodiments having a wire jack termination permits the pluggable insertion of connecting wires into the test probe connector, and also permits smaller spacing between probes since clearance for wire wrapping of wire wrap pins is not needed. While the connector 200 (or 300) is illustrated as being fabricated as a single component, in an alternative embodiment, a connector having a wire jack receptacle 210 on the end opposite the connector pin 202, may also be fabricated as an assemblage of two or more components.

An advantage of the presently described probe and connector is that no sleeves or sockets are used for holding and vertically aligning the probes. Indeed, the probes are positioned on their corresponding connectors which engage detents in the probe that resiliently and releasably hold and support the probe. This prevents the probes from being accidentally released e.g. during assembly of the fixture. Moreover, the intermediate plate allows the probes to be substantially vertically aligned. The absence of the probe-carrying sockets or sleeves allow the use of probes of larger diameters, for a given required probe spacing, which will consequently be more sturdy and less likely to be accidentally damaged and which will resist wear longer than probes using sleeves or sockets.

Also, the alignment of the probes with their respective contact tips on the printed circuit board is enhanced by the presence of the top plate throughbores which extend from the probe tip up to the printed circuit board, thus preventing the probe tip from being laterally offset and to contact the printed circuit board elsewhere than on its intended contact point thereon. The intermediate plate throughbores, and the fact that the alignment rods are fixed to the top plate instead of the probe plate, also help improve alignment of the probes with their respective intended contact points on the printed circuit board.

It should be noted that the presently disclosed test probes and connectors may be fabricated of any suitable metal such as berylium copper and may be plated with gold or other suitable material to enhance conductivity and/or to reduce corrosion.

It will be appreciated by those of ordinary skill in the art that modifications to and variations of the above described socketless probe may be made without departing from the inventive concepts described herein. Accordingly, the invention should not be viewed as limited except as by the scope and spirit of the appended claims.

What is claimed is:

1. A probe and connector assembly for use in a socketless fixture and for providing electrical contact with electrical circuits during testing thereof, said assembly comprising:
    a probe comprising:
        an electrically conductive tubular housing;
        an electrically conductive plunger captively disposed in the electrically conductive tubular housing in electrically conductive contact therewith and having a circuit contacting tip urged outward from the housing under the force of a longitudinally compressed coil spring;
        said tubular housing having a first end portion through which the plunger extends to the tip and by which the plunger is retained in the housing and a second end defining an opening; and
    an electrically conductive connector comprising:
        a pin end sized to achieve an interference fit with said housing second end when disposed within said opening, said end pin providing electrically conductive connection between the connector and the probe when disposed within said opening; and
        a termination end having a wire jack receptacle for pluggably receiving a wire jack pin.

2. The assembly of claim 1 wherein said connector includes at its termination end a tubular portion adapted to receive the wire jack pin with an interference fit.

3. The assembly of claim 1 wherein the connector has an annular barb formed on the exterior thereof to provide captive mounting in an opening within a fixture plate.

4. The assembly of claim 1 wherein said connector has a cylindrical portion attached to said pin and said cylindrical body portion includes two annular externally extending beads for retaining said connector via a press fit in an opening within a fixture plate.

5. The assembly of claim 1 wherein said connector includes a tapered portion of increasing diameter extending between said pin end and said body, said connector and probe forming a seal when the pin is disposed in assembled relation within said opening defined by said second end with said second end in circumferential abutting relation with said tapered portion of said connector.

6. The assembly of claim 2 wherein the tubular portion of the connector comprises a crimp portion to receive the wire jack pin with an interference fit.

7. The assembly of claim 6 wherein the crimp portion includes slots through the wall of the tubular portion to provide a crimped non-circular cross section for interference fit of an inserted wire jack pin.

8. The assembly of claim 2 wherein the tubular portion includes one or more detents extending inward in the tubular portion to provide an interference fit with an inserted wire jack pin.

9. For use in a test probe assembly of a socketless fixture and for providing electrical contact with electrical circuits during testing thereof, an electrically conductive connector comprising:
    a cylindrical body portion having at least one annular externally extending bead for retaining said connector in an opening within a fixture plate;
    said body portion having a pin end sized to achieve an interference fit with a receptacle end of a test probe, said end pin providing electrically conductive connection between the connector and the test probe; and
    said body portion having a termination end having a wire jack receptacle for pluggably receiving a wire jack pin.

10. The connector of claim 9 wherein the termination end of the body portion includes a tubular crimp portion adapted to receive the wire jack pin with an interference fit.

11. The connector of claim 9 wherein said body portion includes a tapered portion of increasing diameter extending between said pin end and said body.

12. The connector of claim 9 wherein the wire jack receptacle of the connector includes a crimp portion to receive the wire jack pin with an interference fit.

13. The connector of claim 12 wherein the crimp portion has slots through the walls of the receptacle to provide a crimped non-circular cross section for receiving the wire jack pin with an interference fit.

14. The connector of claim 9 wherein the wire jack receptacle includes one or more detents extending inwardly into the receptacle to receive the wire jack pin with an interference fit.

15. The connector of claim 14 wherein the receptacle includes a blind hole in the termination end and three detents equispaced about the circumference of the receptacle and an opening through the wall of the termination end near the blind end of the blind hole to facilitate the flow of a plating solution during plating of the receptacle.

* * * * *